United States Patent
Hatch et al.

(10) Patent No.: US 10,941,930 B2
(45) Date of Patent: Mar. 9, 2021

(54) RADIALLY SYMMETRIC ELECTRICAL CONNECTOR

(71) Applicant: KICHLER LIGHTING, LLC, Cleveland, OH (US)

(72) Inventors: Nicholas M. Hatch, Cleveland, OH (US); Matthew D. Kollarits, Seven Hills, OH (US)

(73) Assignee: Kichler Lighting, LLC, Cleveland, OH (US)

( * ) Notice: Subject to any disclaimer, the term of this patent is extended or adjusted under 35 U.S.C. 154(b) by 197 days.

(21) Appl. No.: 16/201,622

(22) Filed: Nov. 27, 2018

(65) Prior Publication Data

US 2020/0166202 A1 May 28, 2020

(51) Int. Cl.
| | |
|---|---|
| *F21V 23/06* | (2006.01) |
| *F21K 9/20* | (2016.01) |
| *H01R 12/78* | (2011.01) |
| *H01R 12/77* | (2011.01) |
| *F21Y 103/10* | (2016.01) |
| *F21Y 115/10* | (2016.01) |

(52) U.S. Cl.
CPC ............... *F21V 23/06* (2013.01); *F21K 9/20* (2016.08); *H01R 12/777* (2013.01); *H01R 12/778* (2013.01); *H01R 12/78* (2013.01); *F21Y 2103/10* (2016.08); *F21Y 2115/10* (2016.08)

(58) Field of Classification Search
CPC combination set(s) only.
See application file for complete search history.

(56) References Cited

U.S. PATENT DOCUMENTS

| | | | |
|---|---|---|---|
| 5,559,681 A | 9/1996 | Duarte | |
| 5,565,728 A * | 10/1996 | Jung | F21S 2/00 313/318.02 |
| 5,743,625 A * | 4/1998 | Tanner | F16L 3/13 362/216 |
| 5,927,845 A | 7/1999 | Gustafson et al. | |
| 6,250,966 B1 * | 6/2001 | Hashimoto | H01R 12/778 439/631 |
| 6,260,981 B1 * | 7/2001 | Fiene | F21V 19/0075 362/147 |
| 6,439,736 B1 * | 8/2002 | Fiene | E04B 9/32 362/147 |

(Continued)

FOREIGN PATENT DOCUMENTS

| | | |
|---|---|---|
| WO | 2012109683 A1 | 8/2012 |
| WO | 2017188914 A1 | 11/2017 |

*Primary Examiner* — Adam D Houston
(74) *Attorney, Agent, or Firm* — Brooks Kushman P.C.

(57) ABSTRACT

A light assembly is provided with a circuit board, a connector and a first light emitting device. The circuit board is formed with a first conductive path and a second conductive path. The connector is supported by the circuit board and includes a first terminal connected to the first conductive path and at least two second terminals connected to the second conductive path. The at least two second terminals are arranged radially symmetrical about an axis and are adapted to engage mating terminals of a mating connector when the mating connector is oriented in both a first position and in a second position that is angularly offset from the first position about the axis. The first light emitting device is supported by the circuit board and in electrical communication with the first conductive path and the second conductive path.

20 Claims, 6 Drawing Sheets

(56) References Cited

U.S. PATENT DOCUMENTS

| | | | |
|---|---|---|---|
| 6,508,567 B1* | 1/2003 | Fiene | F21V 17/101 |
| | | | 362/147 |
| 8,262,250 B2 | 9/2012 | Li et al. | |
| 8,714,772 B1 | 5/2014 | Levante et al. | |
| 8,814,386 B2* | 8/2014 | So | F21S 4/28 |
| | | | 362/249.02 |
| 8,814,590 B2 | 8/2014 | Turco et al. | |
| 9,052,074 B2 | 6/2015 | Katzler et al. | |
| 9,057,504 B2 | 6/2015 | Levante et al. | |
| 9,115,858 B2 | 8/2015 | Levante et al. | |
| 9,166,319 B2 | 10/2015 | Gingrich, III et al. | |
| 9,172,163 B2 | 10/2015 | Zantout et al. | |
| 9,239,136 B1 | 1/2016 | Petersen et al. | |
| 9,293,848 B2 | 3/2016 | Zantout | |
| 9,509,110 B1 | 11/2016 | Buck et al. | |
| 9,531,121 B1 | 12/2016 | Senofsky et al. | |
| 9,570,817 B1 | 2/2017 | Wang et al. | |
| 9,583,903 B1 | 2/2017 | Buck et al. | |
| 9,620,889 B1 | 4/2017 | Buck et al. | |
| 9,647,349 B1 | 5/2017 | Stillman | |
| 9,742,109 B1 | 8/2017 | Senofsky et al. | |
| 9,909,743 B2 | 3/2018 | Dankelmann et al. | |
| 9,917,387 B2 | 3/2018 | Bobbo et al. | |
| 9,945,547 B2 | 4/2018 | Farrnbacher et al. | |
| 2003/0002279 A1* | 1/2003 | Fiene | E04B 9/32 |
| | | | 362/147 |
| 2009/0153077 A1 | 6/2009 | Noh | |
| 2010/0008090 A1* | 1/2010 | Li | F21S 4/24 |
| | | | 362/249.03 |
| 2010/0075541 A1* | 3/2010 | Niitsu | H01R 12/78 |
| | | | 439/658 |
| 2013/0130534 A1 | 5/2013 | Ohkuma | |
| 2014/0104857 A1* | 4/2014 | Spintge | F21V 21/02 |
| | | | 362/368 |
| 2015/0043212 A1* | 2/2015 | Coffey | F21V 17/101 |
| | | | 362/294 |
| 2016/0334090 A1 | 11/2016 | Zanotto et al. | |
| 2017/0005424 A1* | 1/2017 | Lee | H01R 12/775 |
| 2017/0033512 A1* | 2/2017 | Chen | H01R 13/6581 |
| 2017/0223791 A1* | 8/2017 | Fukuda | H05B 45/37 |
| 2018/0001407 A1* | 1/2018 | Wu | B23K 26/24 |
| 2018/0006389 A1* | 1/2018 | Wieters | H01R 12/67 |
| 2018/0031190 A1 | 2/2018 | Nicolai et al. | |
| 2018/0040969 A1* | 2/2018 | Wu | H01R 12/596 |
| 2019/0120443 A1* | 4/2019 | Xia | F21S 6/003 |
| 2019/0137055 A1* | 5/2019 | Liu | F21V 17/06 |
| 2020/0166202 A1* | 5/2020 | Hatch | H01R 12/78 |
| 2020/0248880 A1* | 8/2020 | Hamer | F21V 23/06 |
| 2020/0292138 A1* | 9/2020 | Crayford | F21V 3/061 |

* cited by examiner

1 - +
2 - R
3 - G
4 - B
× - BLANK

1 - +   4 - B
2 - R   5 - WARM W
3 - G   6 - COOL W

FIG. 13

1 - +   4 - B
2 - R   5 - WARM W
3 - G   6 - COOL W

RADIALLY SYMMETRIC ELECTRICAL CONNECTOR

TECHNICAL FIELD

One or more embodiments relate to lighting systems and electrical connectors for lighting systems.

BACKGROUND

Modular lighting systems have become popular in both residential and commercial lighting applications because of their adaptability. Such lighting systems often include light-emitting diodes (LEDs) because of their efficiency and wide range of color and color temperature options. These lighting systems may include one or more elongate strip lights, or "tape lights," having a flexible printed circuit board (PCB) with LEDs connected to the PCB at regular intervals along its length. A strip light can be placed in long rigid extrusions, which may be referred to as "hard strip lights," to provide the same sort of form factor as that of a traditional fluorescent or incandescent fixture. A strip light may include an adhesive backing for adhering to a surface, which may be referred to as a "tape light."

Such lighting systems may include multiple elongate strip lights that are routed around various objects, such as kitchen cabinets, outdoor patios, etc. during installation. Making electrical connections to strip lights typically involves soldering wires to the strip light or connecting the existing wires with mechanical crimps. These installation processes include a number of delicate steps and may require extra equipment to perform, such as soldering equipment and crimping tools. Further, it may be difficult to install such lighting systems while maintaining proper electrical polarity throughout each electrical circuit.

SUMMARY

In one embodiment, a light assembly is provided with a circuit board, a connector and a first light emitting device. The circuit board is formed with a first conductive path and a second conductive path. The connector is supported by the circuit board and includes a first terminal connected to the first conductive path and at least two second terminals connected to the second conductive path. The at least two second terminals are arranged radially symmetrical about an axis and are adapted to engage mating terminals of a mating connector when the mating connector is oriented in both a first position and in a second position that is angularly offset from the first position about the axis. The first light emitting device is supported by the circuit board and in electrical communication with the first conductive path and the second conductive path.

In another embodiment, an electrical connector is provided with a housing centered about an axis with at least two first terminals and at least two second terminals. The first terminals are supported by the housing and angularly spaced apart from each other along a first radius relative to an axis. The at least two second terminals are supported by the housing and angularly spaced apart from each other along a second radius relative to the axis, wherein the second radius is greater than the first radius. Both the at least two first terminals and the at least two second terminals are adapted to engage mating terminals of a mating connector in both a first position and in a second position that is angularly offset from the first position about the axis.

In yet another embodiment, a lighting system is provided with a power supply with a positive terminal and a negative terminal. The lighting system includes a circuit board formed in an elongate sheet with a first conductive path and a second conductive path extending along a length of the elongate sheet, and a connector supported by the circuit board and centered about an axis extending transversely from the circuit board. The connector includes at least two first terminals connected to the first conductive path and supported by the connector, wherein the at least two first terminals are arranged radially symmetrical relative to each other about the axis at a first radius, and at least two second terminals connected to the second conductive path and supported by the connector, wherein the at least two second terminals are arranged radially symmetrical relative to each other about the axis at a second radius. The lighting system includes a first light emitting device supported by the circuit board and in electrical communication with the first conductive path and the second conductive path and a mating connector. The mating connector includes at least two first mating terminals in electrical communication with the positive terminal and at least two second mating terminals in electrical communication with the negative terminal, wherein at least one of the at least two first mating terminals is adapted to engage at least one of the at least two first terminals when the mating connector is connected to the connector in both a first position and a second position that is angularly offset from the first position about the axis.

As such, the lighting system provides advantages over existing systems by allowing an installer to make an electrical connection between a light assembly and a power supply or another light assembly regardless of the polarity configuration of either device, which simplifies the installation of the lighting system.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
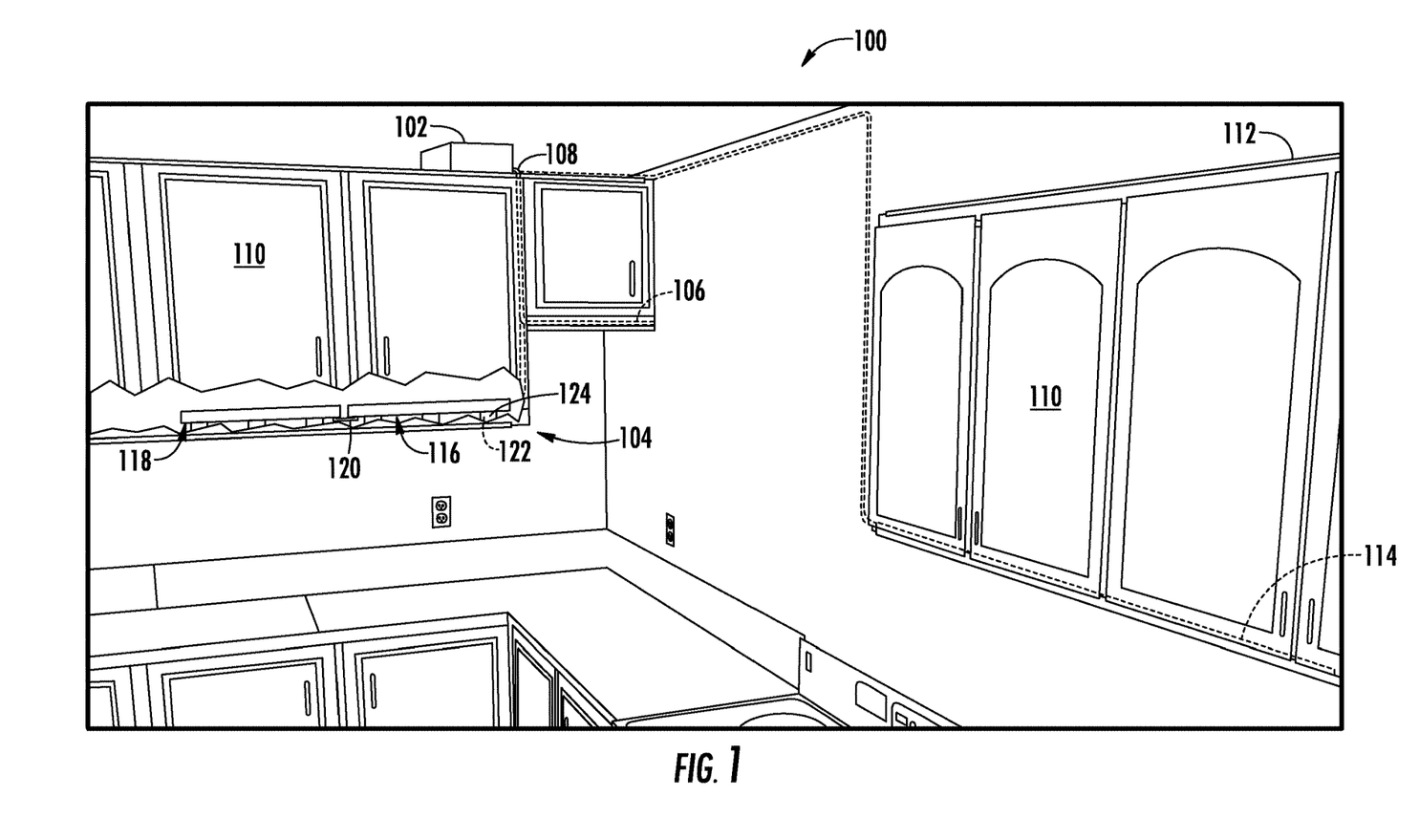
FIG. 1 is a front, partially fragmented, perspective view of a lighting system according to one or more embodiments, illustrated mounted to kitchen cabinets.

With reference to FIG. 1, a lighting system is illustrated in accordance with one or more embodiments and generally referenced by numeral 100. The lighting system 100 includes a power supply 102 that is connected to a first circuit 104 and a second circuit 106 by an electrical harness 108. The first circuit 104 and the second circuit 106 each include strip lights that are mounted to an underside of kitchen cabinets 110 to provide light in a downward direction, i.e., "down lights." The lighting system 100 also includes a third circuit 112 that is mounted to the top of the cabinets 110 to provide light in an upward direction, and a fourth circuit 114 that provides down lighting.

Each light circuit 104, 106, 112, 114 includes one or more light assemblies, tape lights, or strip lights, that are connected to each other by intermediate electrical connectors. For example, the first circuit 104 includes a first strip light 116 that is connected to a second strip light 118 by short electrical connection or jumper 120. The first strip light 116 includes a connector 122 that connects to a mating connector 124 of the electrical harness 108. The first strip light 116 is oriented in a first polarity configuration and the second strip light 118 is oriented in a second polarity configuration. The lighting system 100 includes electrical connectors, such as the connector 122, that can connect to mating connectors, such as mating connector 124, in multiple different positions while maintaining the polarity of the circuit.

Figure 2:
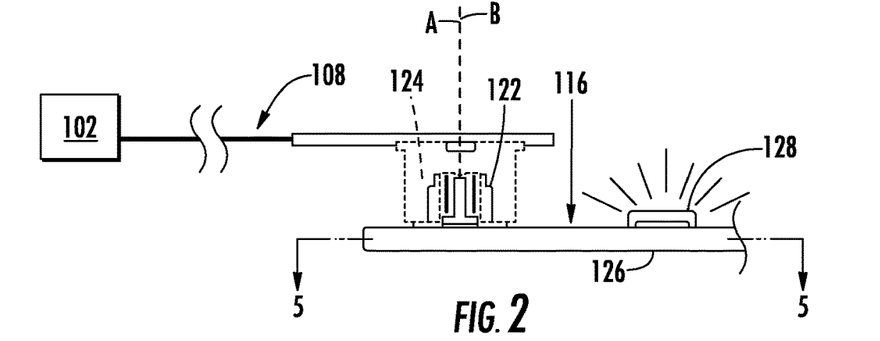
FIG. 2 is a side view of a portion of the lighting system of FIG. 1, illustrating a strip light with an electrical connector that is connected to a mating electrical connector.

Referring to FIG. 2, the lighting system 100 includes electrical connectors that accommodate adjacent strip lights that are arranged in different polarity configurations. The first strip light 116 includes a PCB 126 that is formed in an elongate flexible strip. The PCB 126 supports and electrically connects the connector 122 to one or more LEDs 128. The PCB 126 includes conductive tracks that are etched from one or more sheet layers of copper and laminated onto and/or between sheet layers 129 of a non-conductive substrate (shown in FIG. 4).

Figure 3:
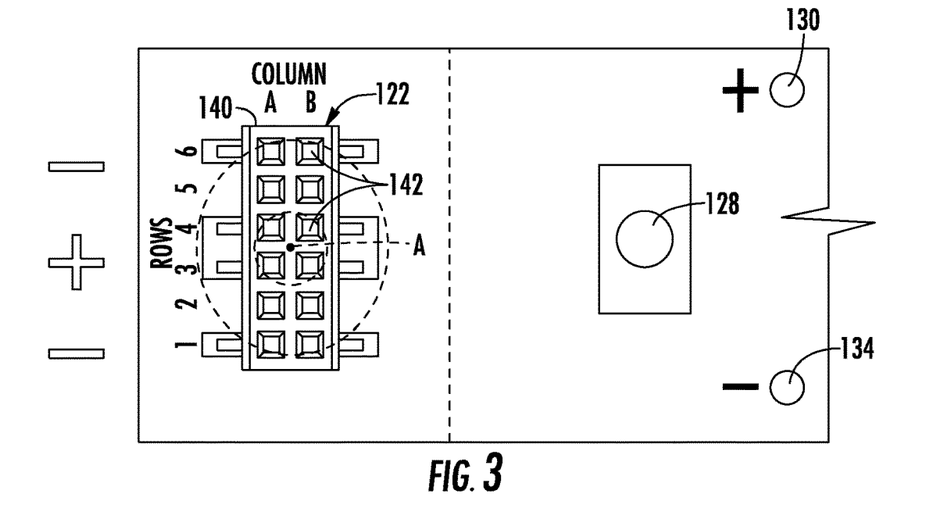
FIG. 3 is a top view of the strip light and electrical connector of FIG. 2.
Figure 4:
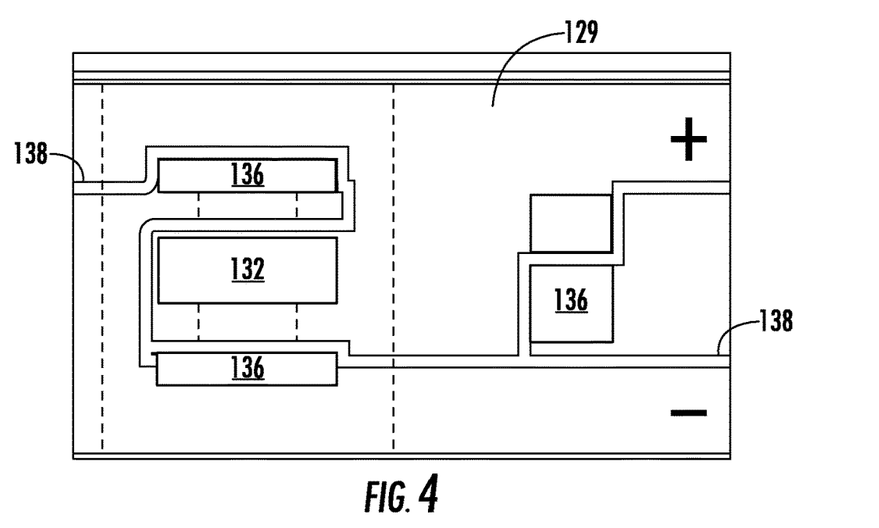
FIG. 4 is a section view of the strip light of FIG. 3 taken along section line 5-5.

Referring to FIGS. 2-4, the first strip light 116 includes externally accessible positive pads 130, and internal positive pads 132 (shown in FIG. 4) that are electrically connected to each other by a positive conductive path or track (not shown). The first strip light 116 also includes externally accessible negative pads 134, and internal negative pads 136 (shown in FIG. 4), along the length of the PCB 126 that are electrically connected to each other by a negative conductive path or track 138. The connector 122 includes a housing 140 and a plurality of terminals 142. In the illustrated embodiment, the connector 122 includes a rectangular shaped housing 140 having six rows (Rows 1-6) of two cavities (Columns A and B) to receive up to twelve female terminals 142. Each terminal 142 extends from, and is electrically connected to, the internal positive pad 132 or the internal negative pad 136. In other embodiments, the connector 122 includes different configurations or a terminal block (not shown), rather than a housing.

The connector 122 of the lighting system 100 includes terminals 142 that are radially symmetric and arranged in concentric circles of common polarity about an imaginary Axis A, according to one or more embodiments. The two innermost rows of cavities (i.e., Rows 3 and 4) receive positive terminals 142 that are oriented radially symmetric about Axis A, as illustrated by a first dashed line circle. The two outermost rows of cavities (i.e., Rows 1 and 6) receive negative terminals 142 that are also oriented radially symmetric about Axis A, as illustrated by a second dashed line circle.

Figure 5:
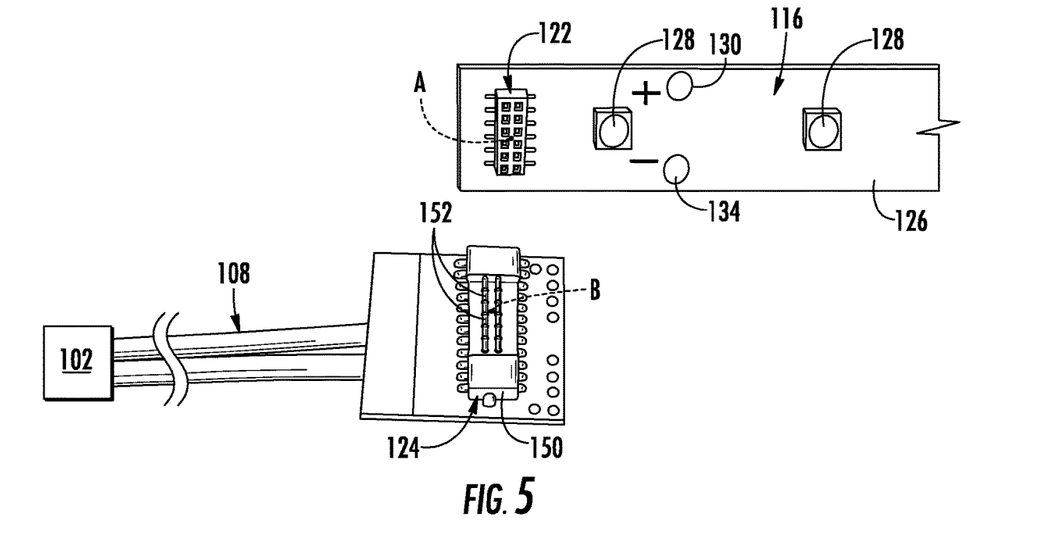
FIG. 5 is a top perspective view of the strip light of FIG. 2 and a bottom perspective view of the mating electrical connector.
Figure 6:
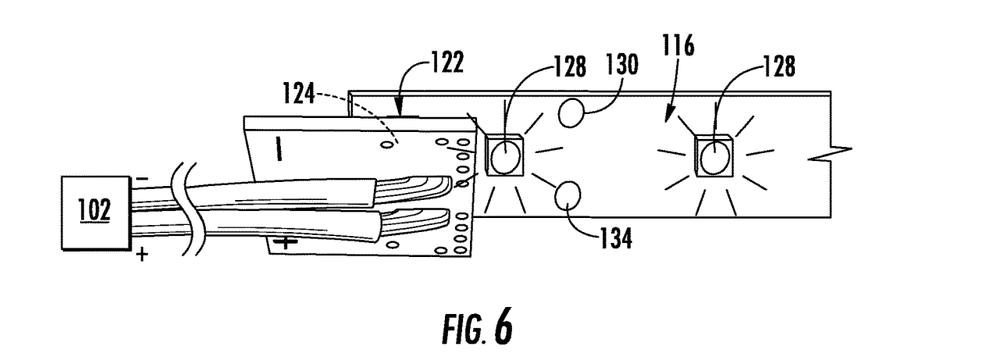
FIG. 6 is another top perspective view of the strip light of FIG. 2 illustrated with the electrical connector connected to the mating connector in a first polarity configuration.
Figure 7:
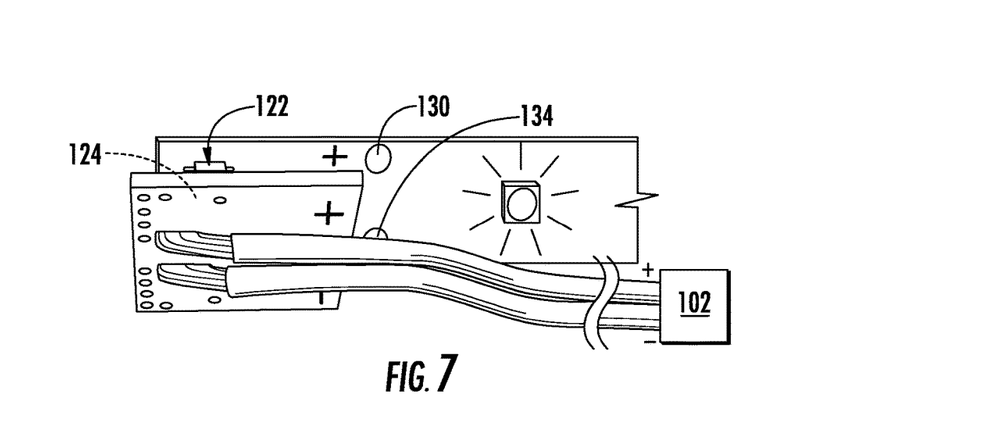
FIG. 7 is yet another top perspective view of the strip light of FIG. 2 illustrated with the electrical connector connected to the mating connector in a second polarity configuration.

With reference to FIGS. 5-7, the radially symmetric arrangement of the terminals 142 in the connector 122 allows the lighting system 100 to make proper electrical connections between devices regardless of the orientation of the corresponding PCBs and connectors. For example, as shown in FIGS. 5-7, the first strip light 116 is arranged in a first polarity configuration with its positive pads 130 aligned along an upper side of the PCB 126 and its negative pads 134 aligned along a lower side of the PCB 126.

The mating connector 124 includes a housing 150 and a plurality of terminals 152. In the illustrated embodiment, the mating connector 124 includes a rectangular shaped housing 150 having six rows of two cavities to receive up to twelve male terminals 152. The terminals 152 are electrically connected to the positive (+) and negative (−) terminals of the power supply 102 through the electrical harness 108. Like the connector 122, the mating connector 124 includes terminals 152 that are radially symmetric and arranged in concentric circles of common polarity about an imaginary Axis B. In other embodiments, the mating connector 124 includes a terminal block (not shown), rather than a housing.

With reference to FIG. 6, the mating connector 124 of the electrical harness 108 is connected to the connector 122 of the first strip light 116, while oriented in an opposite polarity configuration (i.e., the negative wire (−) of the harness 108 is oriented on top as shown in FIG. 6, and the positive pad 130 of the first strip light 116 is oriented on top). Despite the opposing polarity configurations, the LEDs 128 still receive electrical power at the proper polarity and emit light, as depicted by the light lines extending from the LEDs 128. In FIG. 7, the mating connector 124 is connected to the connector 122 while oriented in the same polarity configuration, and the LEDs 128 still receive electrical power at the proper polarity and emit light, as depicted by the light lines extending from the LEDs 128.

Figures 8, 8A, 8B:
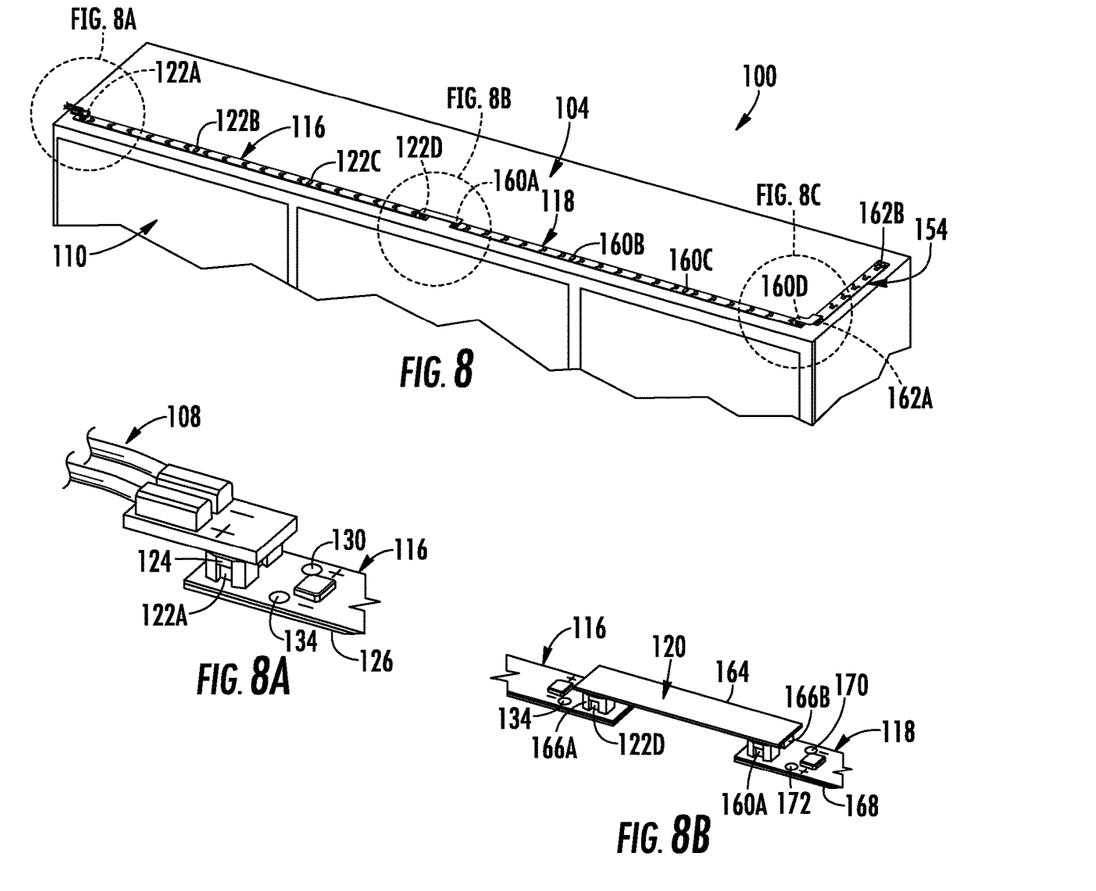
FIG. 8 is a bottom perspective view of the lighting system of FIG. 1, illustrated mounted to the underside of the kitchen cabinets.
FIG. 8A is an enlarged view of a first electrical connector of the lighting system of FIG. 8, illustrated connected to a first mating connector.
FIG. 8B is an enlarged view of a second electrical connector and a third electrical connector of the lighting system of FIG. 8, illustrated connected to corresponding second and third mating connectors.
Figure 8C:
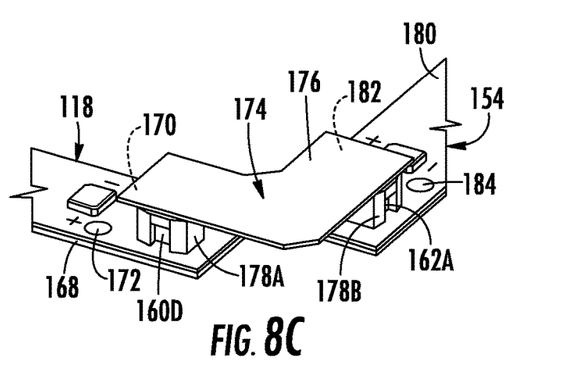
FIG. 8C is an enlarged view of a fourth electrical connector and a fifth electrical connector of the lighting system of FIG. 8, illustrated connected to corresponding fourth and fifth mating connectors.

FIG. 8 illustrates the first circuit 104 of the lighting system 100 mounted to the bottom of the kitchen cabinets 110. The first circuit 104 includes the first strip light 116, the second strip light 118 and a third strip light 154. Each strip light 116, 118, 154 includes connectors with radially symmetric terminals, which allows the lighting system 100 to accommodate different polarity configurations while maintaining the polarity of the first circuit. The first strip light 116 includes a plurality of connectors 122A, 122B, 122C, and 122D that are longitudinally spaced apart from each other along the length of the PCB 126 which allows the installer to cut the first strip light 116 to length to accommodate the shape of the cabinets 110. The second and third strip lights 118, 154 include connectors 160A-160D, 162A-162B, respectively, that include radially symmetric terminals like the connector 122. Referring to FIGS. 8-8C each strip light 116, 118, 154 is connected to an adjacent strip light or power supply that is arranged in a different polarity configuration, however the polarity of the first circuit 104 is maintained due to the flexibility of the radially symmetric terminal configuration of the lighting system 100.

With reference to FIGS. 8 and 8A, the PCB 126 of the first strip light 116 and the electrical harness 108 are oriented in different polarity configurations. The PCB 126 of the first strip light 116 is arranged in a first polarity configuration, with a positive pad 130 arranged on the inside (relative to the doors of the cabinet 110) and a negative pad 134 arranged on the outside. The electrical harness 108 is arranged in a second polarity configuration with a negative wire (−) on the inside and a positive wire (+) on the outside. Despite these different polarity configurations, the lighting system 100 maintains the proper polarity of the first circuit 104 through these devices due to the radially symmetric terminal configurations of the connector 122 of the first strip light 116 and the mating connector 124 of the electrical harness 108.

Referring to FIGS. 8 and 8B, the first strip light 116 and the second strip light 118 are oriented in opposite polarity configurations relative to each other and connected by the jumper 120. The jumper 120 includes a PCB 164 that supports and electrically connects a pair of mating connectors 166A, 166B, that include radially symmetric terminals like the mating connector 124. The PCB 126 of the first strip light 116 is arranged in a first polarity configuration, with a positive pad 130 arranged on the inside (relative to the doors of the cabinet 110) and a negative pad 134 arranged on the outside; whereas a PCB 168 of the second strip light 118 is arranged in a second polarity configuration, with negative pads 170 arranged on the inside (relative to the doors of the cabinet 110) and positive pads 172 arranged on the outside. Despite these different polarity configurations, the lighting system 100 maintains the proper polarity of the first circuit 104 through these devices due to the radially symmetric terminal configurations of the connector 122D, 160A of the first and second strip lights 116, 118 and the corresponding mating connectors 166A, 166B of the jumper 120. With reference to FIGS. 8 and 8C, the second strip light 118 and the third strip light 154 are oriented in opposite polarity configurations relative to each other and connected by a right-angle jumper 174. The right-angle jumper 174 includes a PCB 176 that supports and electrically connects a pair of mating connectors 178A, 178B that include radially symmetric terminals like the mating connector 124.

The PCB 168 of the second strip light 118 is arranged in a second polarity configuration, with negative pads 170 arranged on the inside (relative to the doors of the cabinet 110) and positive pads 172 arranged on the outside. The third strip light 154 includes a PCB 180 that is arranged in a first polarity configuration, with positive pads 182 arranged on the inside (relative to the doors of the cabinet 110) and negative pads 184 arranged on the outside. Despite these different polarity configurations, the lighting system 100 maintains the proper polarity of the first circuit 104 through these devices due to the radially symmetric terminal configurations of the connectors 160D, 162A of the second and third strip lights 118, 154 and the corresponding mating connectors 178A, 178B of the right-angle jumper 174.

FIGS. 9-13 illustrate numerous terminal configurations of the connector 122 when used with strip lights having one or more different color LEDs, according to one or more embodiments. In each embodiment, the connector 122 includes terminals that are radially symmetric and arranged in concentric circles of common polarity about an imaginary Axis A. As described above with reference to FIGS. 5-7, the radially symmetric arrangement of the terminals in the connector 122 allows the lighting system 100 to make proper electrical connections between devices when the mating connector is oriented in a first direction (e.g., FIG. 6) or in a second direction that is 180 degrees angularly offset from the first direction (e.g., FIG. 7) about Axis A.

Figure 9:
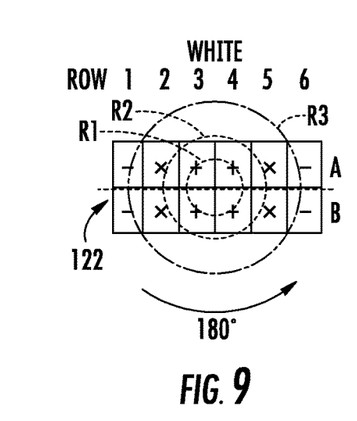
FIG. 9 is a diagram illustrating the pin-out of the electrical connector of FIG. 3, according to one embodiment in which the strip light includes one light channel, including white lights.

With reference to FIG. 9, the first strip light 116 includes a single light circuit, or "channel," that includes LEDs 128 that emit white light, according to one or more embodiments. The connector 122 includes six rows of two cavities to receive up to twelve terminals. The two innermost rows of cavities of the connector 122 (i.e., Row 3, Columns A and B and Row 4, Columns A and B) receive positive terminals (+) that are oriented at a first radius (R1) about Axis A, as illustrated by a first dashed line circle, and connect to the positive conductive path described with reference to FIG. 4. The two intermediate rows of cavities (i.e., Row 2, Columns A and B and Row 5, Columns A and B) are empty (x) and are oriented at a second radius (R2) about Axis A that is greater than the first radius, as illustrated by a second dashed line circle. The two outermost rows of cavities (i.e., Row 1, Columns A and B and Row 6, Columns A and B) receive negative terminals (−) that are oriented at a third radius (R3) about Axis A that is greater than the second radius, as illustrated by a third dashed line circle, and connect to the negative conductive path 138 (shown in FIG. 4).

Figure 10:
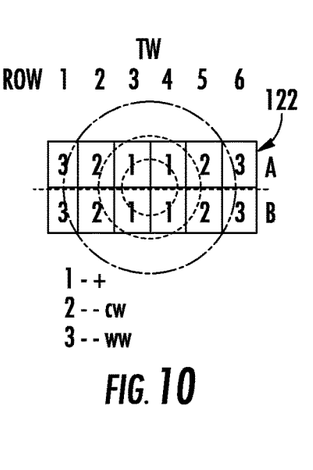
FIG. 10 is a diagram illustrating the pin-out of the electrical connector of FIG. 3, according to another embodiment in which the strip light includes two light channels, including warm and cool white lights.

Referring to FIG. 10, the first strip light 116 includes two light channels, including LEDs that emit cool white light and warm white light, according to one or more embodiments. Such light circuits with multiple different white lights may be referred to as "tunable white" lights. The connector 122 includes six rows of two cavities to receive up to twelve terminals. The two innermost rows of cavities of the connector 122 (i.e., Row 3 Columns A and B and Row 4 Columns A and B) receive positive terminals ("1") that are oriented at a first radius about Axis A, as illustrated by a first dashed line circle, and connect to the positive conductive path described with reference to FIG. 4. The two intermediate rows of cavities (i.e., Row 2, Columns A and B and Row 5, Columns A and B) receive negative terminals ("2") that are oriented at a second radius about Axis A, as illustrated by a second dashed line circle, and connect to a first negative conductive path 138 (shown in FIG. 4). The two outermost rows of cavities (i.e., Row 1, Column A and B and Row 6, Column A and B) receive negative terminals ("3") that are oriented at a third radius about Axis A, as illustrated by a third dashed line circle, and connect to a second negative conductive path (not shown).

Figure 11:
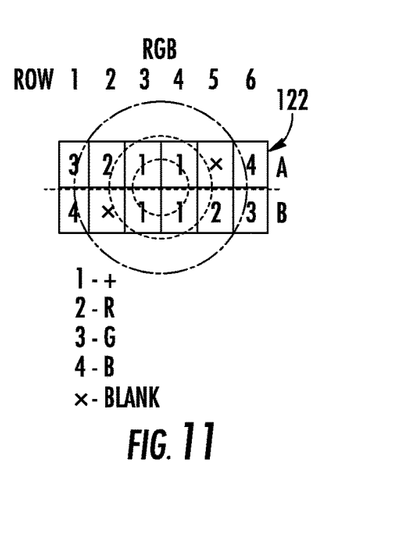
FIG. 11 is a diagram illustrating the pin-out of the electrical connector of FIG. 3, according to yet another embodiment in which the strip light includes three light channels, including red, green, and blue lights.

With reference to FIG. 11, the first strip light 116 includes three light channels, including LEDs that emit red, green, and blue light according to one or more embodiments. The connector 122 includes six rows of two cavities to receive up to twelve terminals. The two innermost rows of cavities of the connector 122 (i.e., Row 3, Columns A and B and Row 4, Columns A and B) receive positive terminals ("1") that are oriented at a first radius about Axis A, as illustrated by a first dashed line circle, and connect to the positive conductive path described with reference to FIG. 4. The two intermediate rows of cavities include: two cavities (i.e., Row 2, Column A and Row 5, Column B) that receive negative terminals ("2") that connect to a negative conductive path associated with the color Red (not shown); and two cavities (i.e., Row 2, Column B and Row 5, Column A) that are empty ("X"). All four cavities are oriented at a second radius about Axis A, as illustrated by a second dashed line circle. The two outermost rows of cavities include: two cavities (i.e., Row 1, Column A and Row 6, Column B) that receive negative terminals ("3") that connect to a negative conductive path associated with the color Green (not shown); and two cavities (i.e., Row 1 Column B and Row 6 Column A) that receive negative terminals ("4") that connect to a negative conductive path associated with the color Blue (not shown). All four cavities are oriented at a third radius about Axis A, as illustrated by a third dashed line circle.

Figure 12:
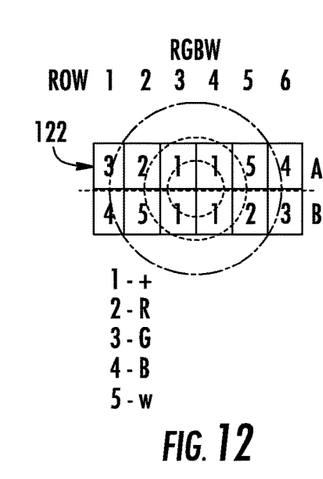
FIG. 12 is a diagram illustrating the pin-out of the electrical connector of FIG. 3, according to still yet another embodiment in which the strip light includes four light channels, including red, green, blue, and white lights.

Referring to FIG. 12, the first strip light 116 includes four light channels, including LEDs that emit red, green, blue, and white light according to one or more embodiments. The connector 122 includes six rows of two cavities to receive up to twelve terminals. The two innermost rows of cavities of the connector 122 (i.e., Row 3, Columns A and B and Row 4, Columns A and B) receive positive terminals ("1") that are oriented at a first radius about Axis A, as illustrated by a first dashed line circle. The positive terminals connect to the positive conductive path described with reference to FIG. 4. The two intermediate rows of cavities include: two cavities (i.e., Row 2, Column A and Row 5, Column B) that receive negative terminals ("2") that connect to a negative conductive path (not shown) associated with the color Red; and two cavities (i.e., Row 2, Column B and Row 5, Column A) that receive negative terminals ("5") that connect to a negative conductive path (not shown) associated with the color White. All four cavities are oriented at a second radius about Axis A, as illustrated by a second dashed line circle. The two outermost rows of cavities include: two cavities (i.e., Row 1, Column A and Row 6, Column B) that receive negative terminals ("3") that connect to a negative conductive path associated with the color Green (not shown); and two cavities (i.e., Row 1, Column B and Row 6, Column A) that receive negative terminals ("4") that connect to a negative conductive path associated with the color Blue (not shown). All four cavities are oriented at a third radius about Axis A, as illustrated by a third dashed line circle.

Figure 13:
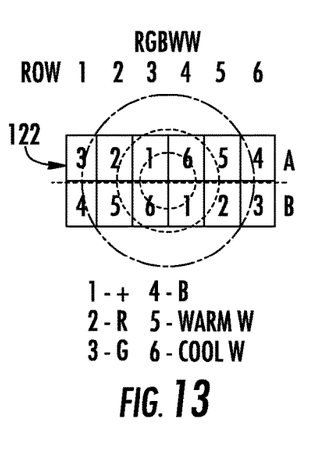
FIG. 13 is a diagram illustrating the pin-out of the electrical connector of FIG. 3, according to another embodiment in which the strip light includes five light channels, including red, green, blue, warm white, and cool white lights.

With reference to FIG. 13, the first strip light 116 includes five light channels, including LEDs that emit red, green, blue, warm white, and cool white light according to one or more embodiments. The connector 122 includes six rows of two cavities to receive up to twelve terminals. The two innermost rows of cavities of the connector 122 include: two cavities (i.e., Row 3, Column A and Row 4 Column B) that receive positive terminals ("1") that connect to a positive conductive path (described with reference to FIG. 4); and two cavities (i.e., Row 3, Column B and Row 4, Column A) that receive negative terminals ("6") that connect to a negative conductive path (not shown) associated with the color Cool White. All four cavities are oriented at a first radius about Axis A, as illustrated by a first dashed line circle. The two intermediate rows of cavities include: two cavities (i.e., Row 2, Column A and Row 5, Column B) that receive negative terminals ("2") that connect to a negative conductive path (not shown) associated with the color Red; and two cavities (i.e., Row 2, Column B and Row 5, Column A) that receive negative terminals ("5") that connect to a negative conductive path (not shown) associated with the color Warm White. All four cavities are oriented at a second radius about Axis A, as illustrated by a second dashed line circle. The two outermost rows of cavities include: two cavities (i.e., Row 1, Column A and Row 6, Column B) that receive negative terminals ("3") that connect to a negative conductive path associated with the color Green (not shown); and two cavities (i.e., Row 1, Column B and Row 6, Column A) that receive negative terminals ("4") that connect to a negative conductive path associated with the color Blue (not shown). All four cavities are oriented at a third radius about Axis A, as illustrated by a third dashed line circle.

Although the illustrated connector 122 is rectangular in shape and sized to receive up to twelve terminals, other embodiments of the connector 122 may include different shapes (e.g., square or circular) and configurations. In one or more embodiments, the connector 122 is rectangular in shape and includes a single column with three or more rows of terminals (not shown). For example, in one embodiment of a single column connector, the connector includes a single central positive terminal, and two outer negative terminals. In another embodiment of a single column connector, the connector includes two central positive terminals, and two outer negative terminals. Additionally, although the illustrated connector 122 is shown with centrally located positive terminals, other embodiments contemplate a connector with one or more centrally located negative terminals. Other embodiments of the lighting system 100 contemplate electrical connectors that are radially symmetrical at an angular rotation of a factor of 360 degrees (e.g., 30, 45, 60, 90 or 180 degrees), but may not be arranged in one or more concentric circles about an imaginary central axis.

Figure 14:
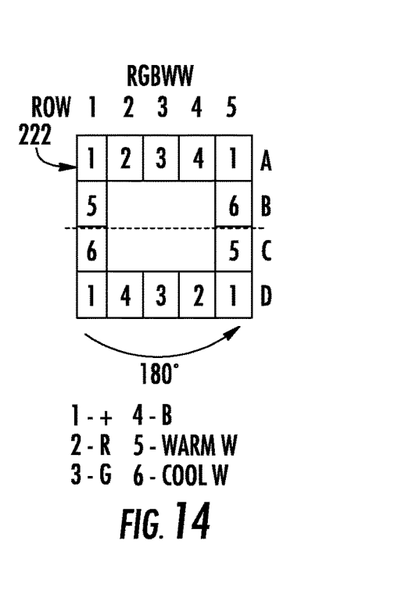
FIG. 14 is a diagram illustrating the pin-out of an electrical connector according to another embodiment, in which the strip light includes five light channels, including red, green, blue, warm white, and cool white lights.

With reference FIG. 14, a connector for the lighting system 100 is illustrated in accordance with one or more embodiments and generally referenced by numeral 222. The connector 222 is similar to the connector 122 described with reference to FIG. 13 in that it includes twelve cavities for receiving terminals, but the cavities are arranged in five rows of four columns, rather than six by two. Although the cavities are not arranged in concentric circles, the cavities are radially symmetrical at an angular rotation of 180 degrees. As described above with reference to FIGS. 5-7, the radially symmetric arrangement of the terminals in the connector 122 allows the lighting system 100 to make proper electrical connections between devices when the mating connector is oriented in a first direction (e.g., FIG. 6) or in a second direction that is 180 degrees angularly offset from the first direction (e.g., FIG. 7) about Axis A.

The first strip light 116 includes LEDs that emit red, green, blue, warm white, and cool white light according to one or more embodiments. The connector 222 includes five rows, with two rows of five cavities, and two rows of two cavities, to receive up to fourteen terminals. The connector 222 includes: two cavities (i.e., Row 1, Column A and Row 5, Column D) that receive positive terminals ("1") that connect to the positive conductive path described with reference to FIG. 4; and two cavities (i.e., Row 2, Column A and Row 4, Column D) that receive negative terminals ("2") that connect to a negative conductive path (not shown) associated with the color Red. The connector 222 also includes: two cavities (i.e., Row 3, Columns A and D) that receive negative terminals ("3") that connect to a negative conductive path (not shown) associated with the color Green; and two cavities (i.e., Row 4, Column A and Row 2 Column D) that receive negative terminals ("4") that connect to a negative conductive path (not shown) associated with the color Blue. The connector 222 also includes: two cavities (i.e., Row 1, Column B and Row 5, Column C) that receive negative terminals ("5") that connect to a negative conductive path (not shown) associated with the color Warm White; and two cavities (i.e., Row 1, Column C and Row 5, Column B) that receive negative terminals ("6") that connect to a negative conductive path (not shown) associated with the color Cool White.

Figure 15:
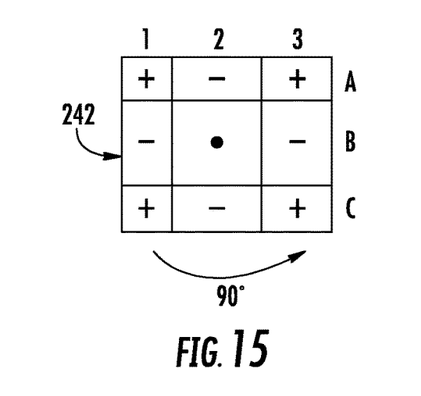
FIG. 15 is a diagram illustrating the pin-out of an electrical connector according to another embodiment, in which the strip light includes one light channel, including white lights.

With reference FIG. 15, a connector for the lighting system 100 is illustrated in accordance with one or more embodiments and generally referenced by numeral 242. The connector 242 is similar to the connector 222 described with reference to FIG. 14 in that it does not include terminal cavities arranged in multiple concentric circles, but the terminal cavities of the connector 242 are arranged in three rows of three columns, rather than six by two. Additionally, the cavities are radially symmetrical at an angular rotation of 90 degrees, rather than 180 degrees. As described above with reference to FIGS. 1-14, the radially symmetric arrangement of the terminals in the connector 122, 222 allows the lighting system 100 to make proper electrical connections between devices when the mating connector is oriented in a first direction (e.g., FIG. 6) or in a second direction that is 180 degrees angularly offset from the first direction (e.g., FIG. 7) about Axis A.

The first strip light 116 includes LEDs that emit white light according to one or more embodiments. The connector 242 includes two rows of three cavities, and one row of two cavities, to receive up to eight terminals. The connector 242 includes: four cavities (i.e., Row 1, Columns A and C; and Row 3, Columns A and C) that receive positive terminals ("1") that connect to the positive conductive path described with reference to FIG. 4; and four cavities (i.e., Row 1, Column B; Row 2, Columns A and C; and Row 3, Column B) that receive negative terminals ("2") that connect to a negative conductive path (not shown) associated with the color White.

Figure 16:
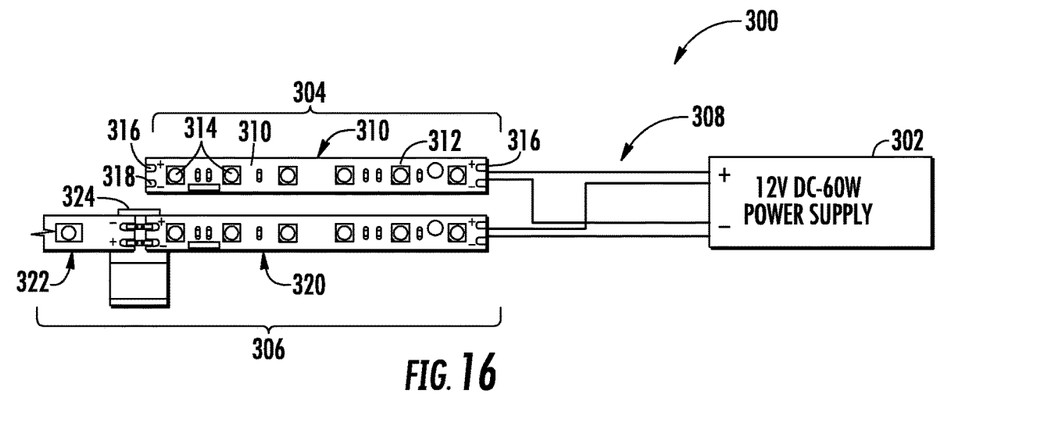
FIG. 16 is a schematic view of an existing lighting system, illustrated with soldered electrical connections and a mechanical electrical connector.

FIG. 16 illustrates an existing lighting system 300 that includes a power supply 302 that is connected to a first circuit 304 and a second circuit 306 by an electrical harness 308. The power supply 302 connects to an alternating current (AC) power supply, e.g., residential 110V supply, and includes a converter for converting the AC voltage to DC voltage. The power supply 302 includes a positive terminal (+) and a negative terminal (−) to supply the DC voltage to the light circuits 304, 306. DC current flows from the positive terminal to the negative terminal through the light circuits 304, 306.

The first circuit 304 includes a first strip light 310 with a flexible printed circuit board (PCB) 312 that supports and electrically connects a plurality of light emitting diodes (LEDs) 314. The PCB 312 includes conductive tracks or paths that are etched from one or more sheet layers of copper and laminated onto and/or between sheet layers of a non-conductive substrate (not shown). The first strip light 310 includes a positive pad 316 at each end of the PCB 312 that are electrically connected to each other by a conductive track. The first strip light 310 also includes a negative pad 318 at each end of the PCB 312 that are electrically connected to each other by a conductive track. The positive pad 316 and the negative pad 318 are connected to the positive (+) and negative (−) terminals of the power supply 302 by the electrical harness 308 by soldered connections.

Figure 16A:
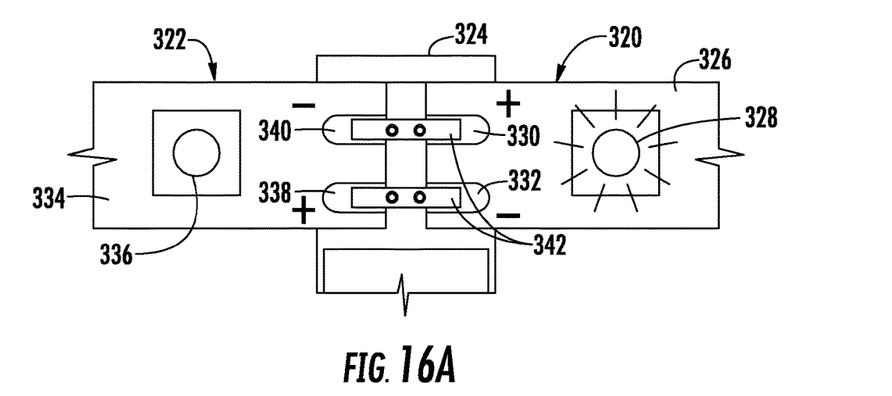
FIG. 16A is an enlarged view of the mechanical electrical connector of FIG. 15.

With reference to FIGS. 16 and 16A, the second circuit 306 includes a first strip light 320 and a second strip light 322 that are connected to each other by an intermediate connector 324. The first strip light 320 includes a PCB 326 with LEDs 328 and a positive pad 330 and a negative pad 332 on each side. The positive pads 330 are longitudinally spaced apart from each other along a length of the PCB 326, and laterally spaced apart from the negative pads 332 along a width of the PCB. The first strip light 320 is arranged in a first polarity configuration with its positive pads 330 aligned along an upper side of the PCB 326 and its negative pads 332 aligned along a lower side of the PCB 326 (as shown in FIGS. 16 and 16A).

The second strip light 322 includes a PCB 334 with LEDs 336 and a positive pad 338 and a negative pad 340 on each side. The second strip light 322 is arranged in a second polarity configuration with its positive pads 338 aligned along a lower side of the PCB 334 and its negative pads 340 aligned along an upper side of the PCB 334. The intermediate connector 324 is a clam-shell type mechanical connector, according to the illustrated embodiment, that includes conductive contacts 342 for connecting longitudinally adjacent pads. However, as shown in FIG. 16A, the longitudinally adjacent pads (e.g., positive pad 330 and negative pad 340) have different polarity which reverses the polarity of the second circuit 306 and disables the LEDs 336 of the second strip light 322, which is represented by light lines extending from the LEDs 328 of the first strip light 320 and no light lines extending from the LEDs 336 of the second strip light 322. To fix such a polarity miss match, an electrician installing such a lighting system 300 could remove and replace the second strip light 322 in the same polarity configuration as the first strip light 320 or make a small jumper harness connecting common polarity pads (not shown). Such electrical adjustments may be difficult to make for lighting systems that are mounted in locations with limited accessibility, such as the third circuit 112 illustrated in FIG. 1.

The lighting system 100 (FIGS. 1-15) includes connectors with terminals that are arranged radially symmetrical with like terminals. The lighting system 100 provides advantages over existing lighting systems (e.g., lighting system 300), for example, by allowing an installer to make an electrical connection between a strip light and a power supply or another strip light regardless of the polarity configuration of either device, which simplifies the installation of the lighting system 100.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A light assembly comprising:
a circuit board formed with a first conductive path and a second conductive path;
a connector supported by the circuit board with at least two first terminals connected to the first conductive path and at least two second terminals connected to the second conductive path, wherein both the at least two first terminals and the at least two second terminals are arranged radially symmetrical about an axis and are adapted to engage mating terminals of a mating connector when the mating connector is oriented in both a first position and in a second position that is angularly offset from the first position about the axis;
wherein the first conductive path is adapted to facilitate current flow in a first direction and wherein the second conductive path is adapted to facilitate current flow in a second direction opposite the first direction; and
a first light emitting device supported by the circuit board and in electrical communication with the first conductive path and the second conductive path.

2. The light assembly of claim 1 wherein the at least two first terminals are oriented at a first radius from the axis, and the at least two second terminals are oriented at a second radius from the axis that is greater than the first radius.

3. The light assembly of claim 1 further comprising:
a third conductive path extending along a length of the circuit board; and
a second light emitting device connected to the first conductive path and the third conductive path, wherein the second light emitting device is adapted to emit a different color light than the first light emitting device.

4. The light assembly of claim 3 further comprising:
at least two third terminals connected to the third conductive path, wherein the at least two third terminals are arranged radially symmetrical relative to each other about the axis; and
wherein the at least two first terminals are oriented at a first radius from the axis, the at least two second terminals are oriented at a second radius from the axis that is greater than the first radius, and the at least two third terminals are oriented at a third radius from the axis that is greater than the first radius and the second radius.

5. The light assembly of claim 3 further comprising:
at least two third terminals connected to the third conductive path, wherein the at least two third terminals are arranged radially symmetrical relative to each other about the axis; and
wherein the at least two first terminals are oriented at a first radius from the axis, the at least two second terminals are oriented at a second radius from the axis that is greater than the first radius, and the at least two third terminals are oriented at a third radius from the axis that equal to one of the first radius and the second radius.

6. The light assembly of claim 3, further comprising:
a fourth conductive path extending along a length of the circuit board; and
a third light emitting device connected to the first conductive path and the fourth conductive path, wherein the third light emitting device is adapted to emit a different color light than the first light emitting device and the second light emitting device.

7. A lighting system comprising:
the light assembly according to claim 1;
a power supply with a positive terminal and a negative terminal;
the mating connector, wherein the mating connector is centered about a second axis;
at least two first mating terminals supported by the mating connector, wherein the at least two first mating terminals are arranged radially symmetrical relative to each other about the second axis;
at least two second mating terminals supported by the mating connector, wherein the at least two second mating terminals are arranged radially symmetrical relative to each other about the second axis; and
an electrical harness with a first wire to connect the positive terminal to the at least two first mating terminals, and a second wire to connect the negative terminal to the at least two second mating terminals;
wherein at least one of the at least two first mating terminals is adapted to engage at least one of the at least two first terminals when the mating connector is oriented in both a first position and a second position that is angularly offset from the first position about the second axis.

8. The lighting system of claim 7, wherein the second position of the mating connector is angularly offset from the first position by at least one of 90 degrees and 180 degrees.

9. A lighting system comprising:
a first light assembly according to claim 1;
a second light assembly according to claim 1; and
a jumper adapted to interconnect the first light assembly to the second light assembly.

10. A light assembly comprising:
a circuit board formed in an elongate sheet with a first conductive path and a second conductive path extending along a length of the elongate sheet;
a housing centered about an axis;
at least two first terminals supported by the housing and angularly spaced apart from each other along a first radius relative to the axis;
at least two second terminals supported by the housing and angularly spaced apart from each other along a second radius relative to the axis, wherein the second radius is greater than the first radius, and wherein both the at least two first terminals and the at least two second terminals are adapted to engage mating terminals of a mating connector in both a first position and in a second position that is angularly offset from the first position about the axis, wherein the housing is supported by the circuit board, wherein the axis extends transversely from the circuit board, and wherein the at least two first terminals are connected to the first conductive path and the at least two second terminals are connected to the second conductive path; and
a first light emitting device supported by the circuit board and in electrical communication with the first conductive path and the second conductive path.

11. The light assembly of claim 10, further comprising:
a third conductive path extending along the length of the elongate sheet; and
a second light emitting device connected to the first conductive path and the third conductive path, wherein the second light emitting device is adapted to emit a different color light than the first light emitting device.

12. The light assembly of claim 11 further comprising:
at least two third terminals connected to the third conductive path and supported by the housing, wherein the at least two third terminals are angularly spaced apart from each other by 180 degrees along a third radius relative to the axis.

13. The light assembly of claim 12 wherein the second radius is greater than the first radius and the third radius is greater than the second radius.

14. The light assembly of claim 12 wherein the second radius is greater than the first radius and the third radius is equal to one of the first radius and the second radius.

15. A lighting system comprising:
a power supply with a positive terminal and a negative terminal;
a circuit board formed in an elongate sheet with a first conductive path and a second conductive path extending along a length of the elongate sheet;
a connector supported by the circuit board and centered about an axis extending transversely from the circuit board;
at least two first terminals connected to the first conductive path and supported by the connector, wherein the at least two first terminals are arranged radially symmetrical relative to each other about the axis at a first radius;
at least two second terminals connected to the second conductive path and supported by the connector, wherein the at least two second terminals are arranged radially symmetrical relative to each other about the axis at a second radius;
a first light emitting device supported by the circuit board and in electrical communication with the first conductive path and the second conductive path;
a mating connector with at least two first mating terminals in electrical communication with the positive terminal and at least two second mating terminals in electrical communication with the negative terminal;
wherein at least one of the at least two first mating terminals is adapted to engage at least one of the at least two first terminals when the mating connector is connected to the connector in both a first position and a second position that is angularly offset from the first position about the axis; and
wherein the first conductive path is adapted to facilitate current flow in a first direction and wherein the second conductive path is adapted to facilitate current flow in a second direction opposite the first direction.

16. The lighting system of claim 15, further comprising:
a third conductive path extending along the length of the elongate sheet; and
a second light emitting device connected to the first conductive path and the third conductive path, wherein the second light emitting device is adapted to emit a different color light than the first light emitting device.

17. The lighting system of claim 16, further comprising:
at least two third terminals connected to the third conductive path and supported by the connector, wherein the at least two third terminals are angularly spaced apart from each other along a third radius relative to the axis, and wherein the third radius is greater than the first radius and the second radius.

18. A lighting system comprising:
the light assembly according to claim 10;
a power supply with a positive terminal and a negative terminal;
the mating connector, wherein the mating connector is centered about a second axis;
at least two first mating terminals supported by the mating connector, wherein the at least two first mating terminals are arranged radially symmetrical relative to each other about the second axis;
at least two second mating terminals supported by the mating connector, wherein the at least two second mating terminals are arranged radially symmetrical relative to each other about the second axis; and
an electrical harness with a first wire to connect the positive terminal to the at least two first mating terminals, and a second wire to connect the negative terminal to the at least two second mating terminals;
wherein at least one of the at least two first mating terminals is adapted to engage at least one of the at least two first terminals when the mating connector is oriented in both a first position and a second position that is angularly offset from the first position about the second axis.

19. The lighting system of claim 18, wherein the second position of the mating connector is angularly offset from the first position by at least one of 90 degrees and 180 degrees.

20. A lighting system comprising:
a first light assembly according to claim 10;
a second light assembly according to claim 10; and
a jumper to interconnect the first light assembly to the second light assembly.

* * * * *